US011705547B2

(12) United States Patent
Chang et al.

(10) Patent No.: US 11,705,547 B2
(45) Date of Patent: Jul. 18, 2023

(54) MANUFACTURING METHOD OF LIGHT EMITTING DIODE MODULE

(71) Applicant: Jentech Precision Industrial Co., LTD., Taoyuan (TW)

(72) Inventors: Jian-Tsai Chang, Taoyuan (TW); Chin-Jui Yu, Taoyuan (TW); Jheng-Dong Huang, Taoyuan (TW)

(73) Assignee: Jentech Precision Industrial Co., LTD., Taoyuan (TW)

( * ) Notice: Subject to any disclaimer, the term of this patent is extended or adjusted under 35 U.S.C. 154(b) by 115 days.

(21) Appl. No.: 17/200,926

(22) Filed: Mar. 15, 2021

(65) Prior Publication Data

US 2021/0367123 A1    Nov. 25, 2021

(30) Foreign Application Priority Data

May 21, 2020    (TW) ................................. 109116963

(51) Int. Cl.
| | |
|---|---|
| *H01L 33/62* | (2010.01) |
| *H01L 33/48* | (2010.01) |
| *H01L 23/498* | (2006.01) |
| *H01L 23/00* | (2006.01) |

(52) U.S. Cl.
CPC ............ *H01L 33/62* (2013.01); *H01L 33/486* (2013.01); *H01L 2933/0066* (2013.01)

(58) Field of Classification Search
CPC ................... H01L 33/62; H01L 33/486; H01L 2933/0066
See application file for complete search history.

(56) References Cited

U.S. PATENT DOCUMENTS

| 2017/0133568 A1 | 5/2017 | Miki |
| 2017/0299867 A1 | 10/2017 | Tsai et al. |
| 2020/0227343 A1* | 7/2020 | Huang .................. H01L 33/486 |

FOREIGN PATENT DOCUMENTS

| JP | 2008-192635 A | 8/2008 |
| JP | 2012-089638 A | 5/2012 |
| JP | 2012-182207 A | 9/2012 |
| JP | 2013-041950 A | 2/2013 |
| JP | 2013-179271 A | 9/2013 |
| JP | 2013-232595 A | 11/2013 |
| JP | 2013-236005 A | 11/2013 |
| JP | 2014-179458 A | 9/2014 |

(Continued)

*Primary Examiner* — Antonio B Crite
(74) *Attorney, Agent, or Firm* — CKC & Partners Co., LLC (57) ABSTRACT

A light emitting diode module includes a first conductive device, a second conductive device, an insulating structure and a plating layer. The first conductive device includes a first metal layer and a first protecting layer covering the first metal layer. The second conductive device includes a second metal layer and a second protecting layer covering the second metal layer. The insulating structure covers around the first and the second conductive devices. The plating layer is disposed on the first and the second protecting layers in a first and a second openings of the insulating structure. The insulating structure covers portions of upper surfaces of the first and the second conductive devices. The plating layer covers remaining portions of the upper surfaces of the first and the second conductive devices. Lower surfaces of the first and the second conductive devices are located in the second opening.

2 Claims, 8 Drawing Sheets

(56) References Cited

FOREIGN PATENT DOCUMENTS

| | | | |
|---|---|---|---|
| JP | 2016-001702 A | 1/2016 | |
| JP | 2016-119464 A | 6/2016 | |
| JP | 2016181733 A | * 10/2016 | |
| JP | 2017-117901 A | 6/2017 | |
| JP | 2017-157644 A | 9/2017 | |
| JP | 2020088302 A | * 6/2020 | ............ H01L 33/54 |

* cited by examiner

MANUFACTURING METHOD OF LIGHT EMITTING DIODE MODULE

RELATED APPLICATIONS

This application claims priority to Taiwanese Application Serial Number 109116963 filed May 21, 2020, which is herein incorporated by reference.

BACKGROUND

Technical Field

The present disclosure relates to optical equipment and its manufacturing method. More particularly, the present disclosure relates to light emitting diode modules and their manufacturing method.

Description of Related Art

Light-emitting diodes have been widely used in different fields because of their advantages of small size, high efficiency, long life, low energy consumption, etc.

For the existing light-emitting diodes, there is a way of packaging using Quad Flat No-leads (QFN). By extending downwards and disposing the electrical connection points on the bottom surface of the package component, the advantages of high-density and small-volume for packaging are achieved. However, how to provide a light-emitting package component with a higher reliability is one of the objectives that those skilled in the art continue to develop.

SUMMARY

A technical aspect of the present disclosure is to provide a light emitting device, which can have a higher reliability.

According to an embodiment of the present disclosure, a light emitting diode module includes a first conductive device, a second conductive device, an insulating structure and a first plating layer. The first conductive device includes a first metal layer and a first protecting layer. The first protecting layer covers the first metal layer. The second conductive device includes a second metal layer and a second protecting layer. The second protecting layer covers the second metal layer. The insulating structure covers around the first conductive device and around the second conductive device. The insulating structure includes a first opening and a second opening. The first plating layer is disposed on the first protecting layer and the second protecting layer in the first opening and the second opening. The first conductive device has a first upper surface and a first lower surface. The second conductive device has a second upper surface and a second lower surface. The insulating structure covers a portion of the first upper surface and a portion of the second upper surface. The first plating layer covers a remaining portion of the first upper surface and a remaining portion of the second upper surface. The first lower surface and the second lower surface are located in the second opening.

In one or more embodiments of the present disclosure, a material of the first metal layer and a material of the second metal layer are copper.

In one or more embodiments of the present disclosure, a material of the first protecting layer and a material of the second protecting layer are nickel.

In one or more embodiments of the present disclosure, a material of the first plating layer is palladium.

In one or more embodiments of the present disclosure, the light emitting diode module includes a second plating layer. The second plating layer is disposed on the first plating layer. A material of the second plating layer is gold.

In one or more embodiments of the present disclosure, a material of the first plating layer is silver.

Another technical aspect of the present disclosure is to provide a method of manufacturing a light emitting diode module, which can manufacture a light emitting diode module with a higher reliability.

According to an embodiment of the present disclosure, a method of manufacturing a light emitting diode module includes covering a first protecting layer on a first metal layer to form a first conductive device, and covering a second protecting layer on a second metal layer to form a second conductive device; covering around the first conductive device and around the second conductive device by an insulating structure, in which the insulating structure includes a first opening and a second opening; and disposing a first plating layer on the first protecting layer and the second protecting layer in the first opening and the second opening.

In one or more embodiments of the present disclosure, the method further includes disposing a second plating layer on the first plating layer.

In one or more embodiments of the present disclosure, the method further includes treating superficially the insulating structure and the first protecting layer and the second protecting layer in the first opening and the second opening before disposing the first plating layer.

When compared with the prior art, the above-mentioned embodiments of the present disclosure have at least the following advantage: the light emitting diode module can provide a good interface of electrical connection though the protection of the first metal layer by the first protecting layer, the protection of the second metal layer by the second protecting layer, and the disposal of the first plating layer on the first conductive device and the second conductive device exposed from the insulating structure. The method of manufacturing the light emitting diode module in this embodiment can manufacture the light emitting diode module with a higher reliability through forming the first protecting layer and the second protecting layer before covering the insulating structure, and forming the first plating layer after covering the insulating structure.

BRIEF DESCRIPTION OF THE DRAWINGS

The disclosure can be more fully understood by reading the following detailed description of the embodiments, with reference made to the accompanying drawings as follows.

DETAILED DESCRIPTION

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
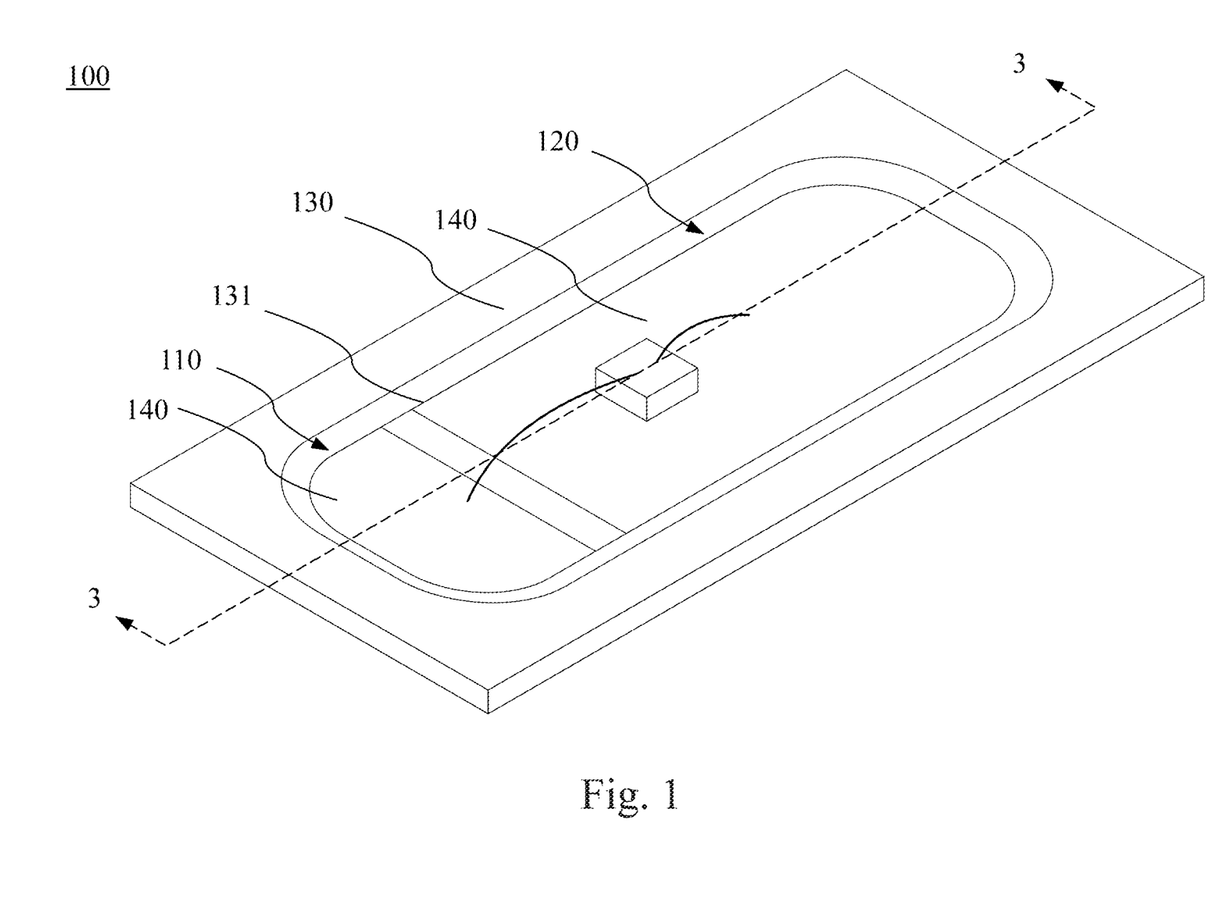
FIG. 1 and FIG. 2 are schematic views of a light emitting diode module according to an embodiment of the present disclosure.
Figure 2:
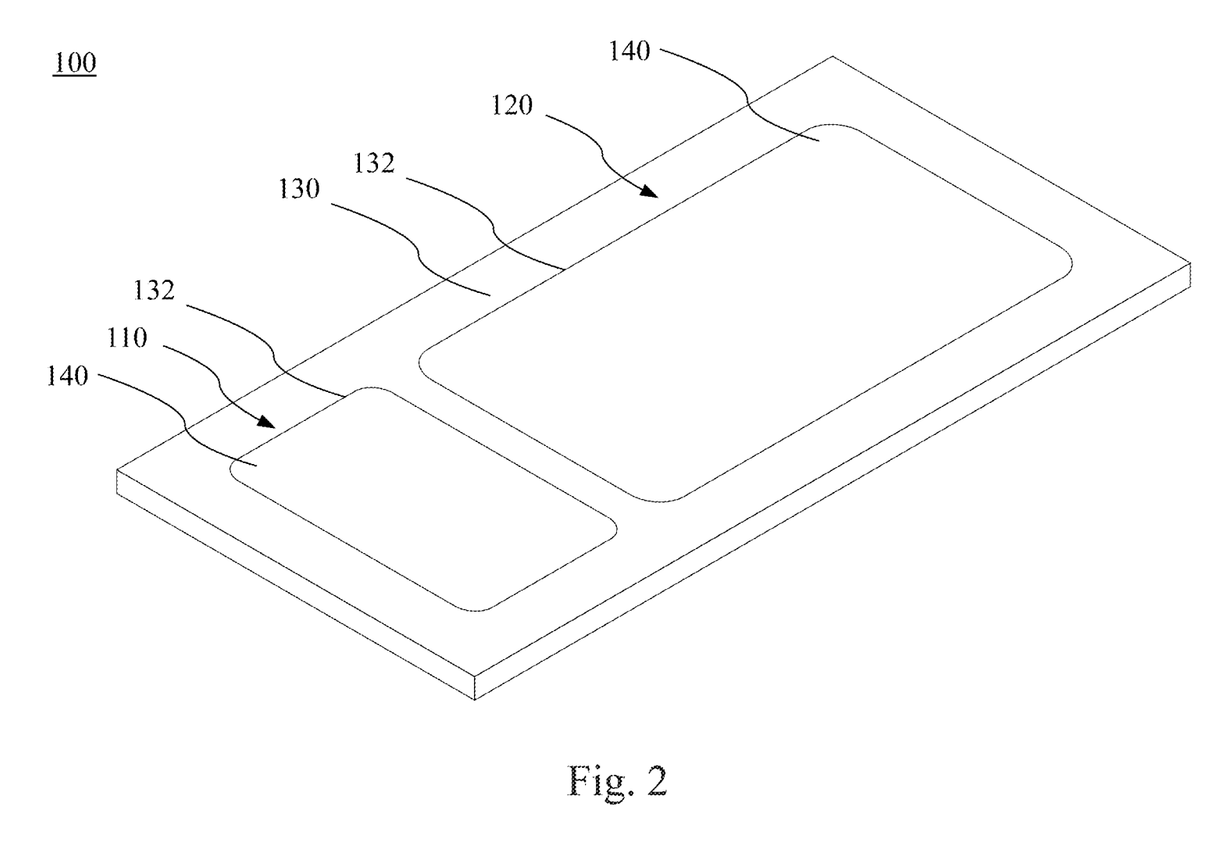

FIG. 1 and FIG. 2 are schematic views of a light emitting diode module according to an embodiment of the present disclosure, in which FIG. 1 shows a first opening of an insulating structure while FIG. 2 shows a second opening of an insulating structure. As shown in FIG. 1, a light emitting diode module 100 includes a first conductive device 110, a second conductive device 120, an insulating structure 130 and a first plating layer 140.

To be specific, the insulating structure 130 includes a first opening 131, and the first plating layer 140 is disposed on the first conductive device 110 and the second conductive device 120 in the first opening 131. To be more specific, as shown in FIG. 1 and FIG. 2, the first conductive device 110 and the second conductive device 120 are covered by the first plating layer 140. The details are illustrated below with sectional views.

Reference is made to FIG. 2. The insulating structure 130 includes a second opening 132, and the first plating layer 140 is disposed on the first conductive device 110 and the second conductive device 120 in the second opening 132.

Figure 3:
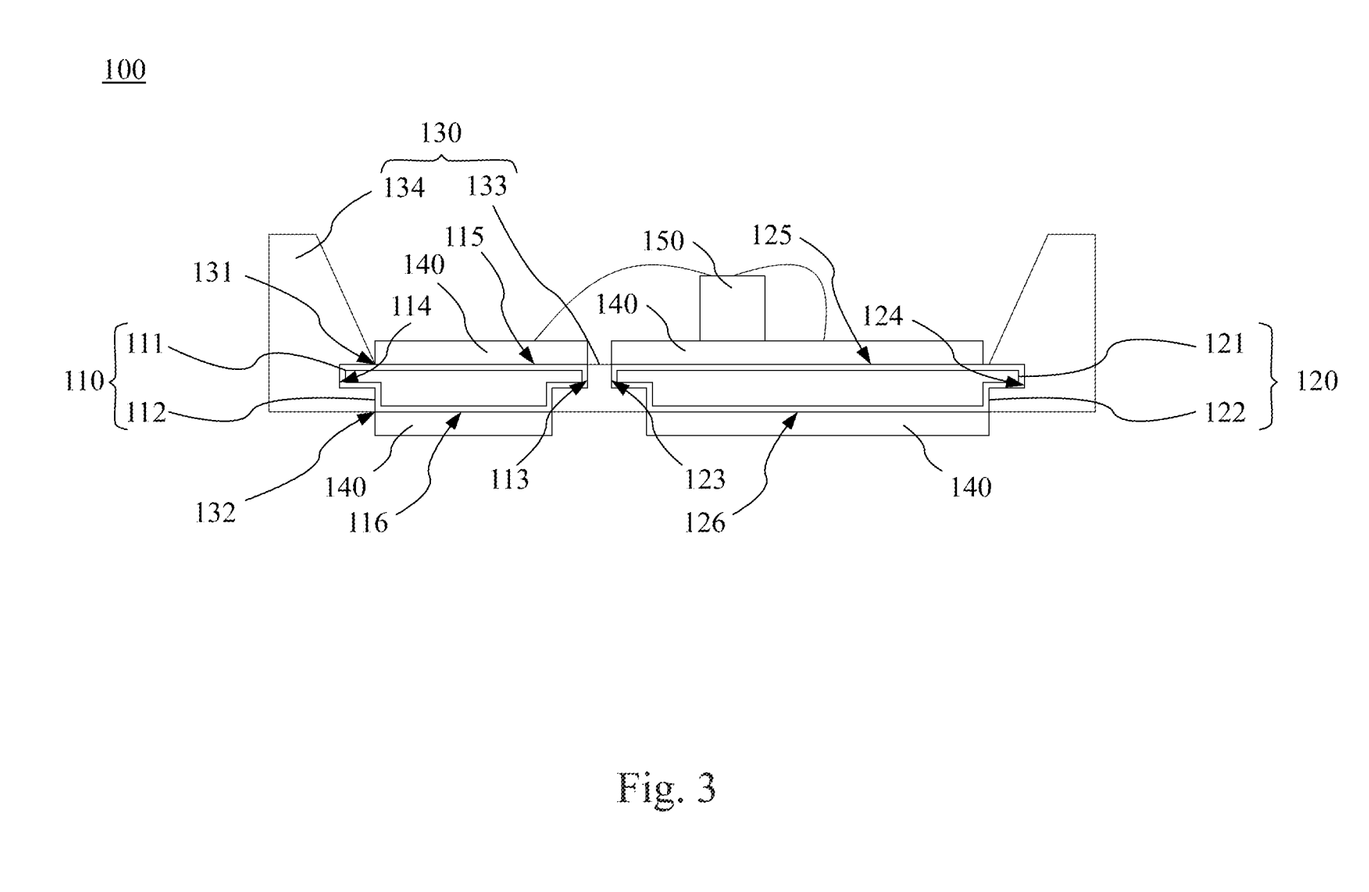
FIG. 3 is a cross-sectional view along a cutting line 3 of FIG. 1.

FIG. 3 is a cross-sectional view along a cutting line 3 of FIG. 1. Reference is made to FIG. 3. The first conductive device 110 includes a first metal layer 111 and a first protecting layer 112. The first protecting layer 112 covers the first metal layer 111. The second conductive device 120 includes a second metal layer 121 and a second protecting layer 122. The second protecting layer 122 covers the second metal layer 121.

The insulating structure 130 covers around the first conductive device 110 and around the second conductive device 120. The first plating layer 140 is disposed on the first protecting layer 112 and the second protecting layer 122 in the first opening 131 and the second opening 132. In other words, in this embodiment, the insulating structure 130 directly contacts a portion of the first protecting layer 112 and a portion of the second protecting layer 122.

To be specific, the insulating structure 130 can have an isolating bar 133, and the isolating bar 133 is disposed between the first conductive device 110 and around the second conductive device 120. In other words, an edge 113 of the first conductive device 110 facing to the second conductive device 120 is covered by the isolating bar 133, and an edge 123 of the second conductive device 120 facing to the first conductive device 110 is also covered by the isolating bar 133.

The insulating structure 130 can have an annular cup 134, and the isolating bar 133 is connected with the annular cup 134. A remaining edge 114 of the first conductive device 110 and a remaining edge 124 of the second conductive device 120 are covered by the annular cup 134 of the insulating structure 130.

In addition, the first conductive device 110 has a first upper surface 115 and a first lower surface 116. The second conductive device 120 has a second upper surface 125 and a second lower surface 126.

The insulating structure 130 covers a portion of the first upper surface 115 and a portion of the second upper surface 125, and the region covered by the insulating structure 130 does not have the first plating layer 140. The first plating layer 140 covers a remaining portion of the first upper surface 115 and a remaining portion of the second upper surface 125. The first lower surface 116 and the second lower surface 126 are located in the second opening 132.

On the other hand, the first upper surface 115 and the second upper surface 125 are coplanar. Thus, the first plating layer 140 is disposed on the first upper surface 115 and the second upper surface 125, forming a surface suitable for a light emitting diode chip 150 to be disposed on and electrically connected with.

To be specific, a material of the first metal layer 111 and a material of the second metal layer 121 are copper. A material of the first protecting layer 112 and a material of the second protecting layer 122 are nickel. However, this does not intend to limit the present disclosure. In other embodiments of the present disclosure, the material of the first metal layer 111 and the material of the second metal layer 121 can be of other conductive materials.

Therefore, in this embodiment, the first protecting layer 112 covering the first metal layer 111 can avoid the first metal layer 111 from forming a displacement reaction, such that the reliability of the product is increased and the reliability of the quality of the electrical connection of the light emitting diode chip 150 is enhanced. For example, the material of the first metal layer 111 and the material of the second metal layer 121 in this embodiment are copper. The first protecting layer 112 and the second protecting layer 122 can respectively protect the first metal layer 111 and the second metal layer 121 and avoid from copper replacement, which can increase the functional reliability of the functions of the product.

On the other hand, a material of the first plating layer 140 is silver. Thus, the first plating layer 140 can further enhance the quality of electrical connection.

Figure 4:
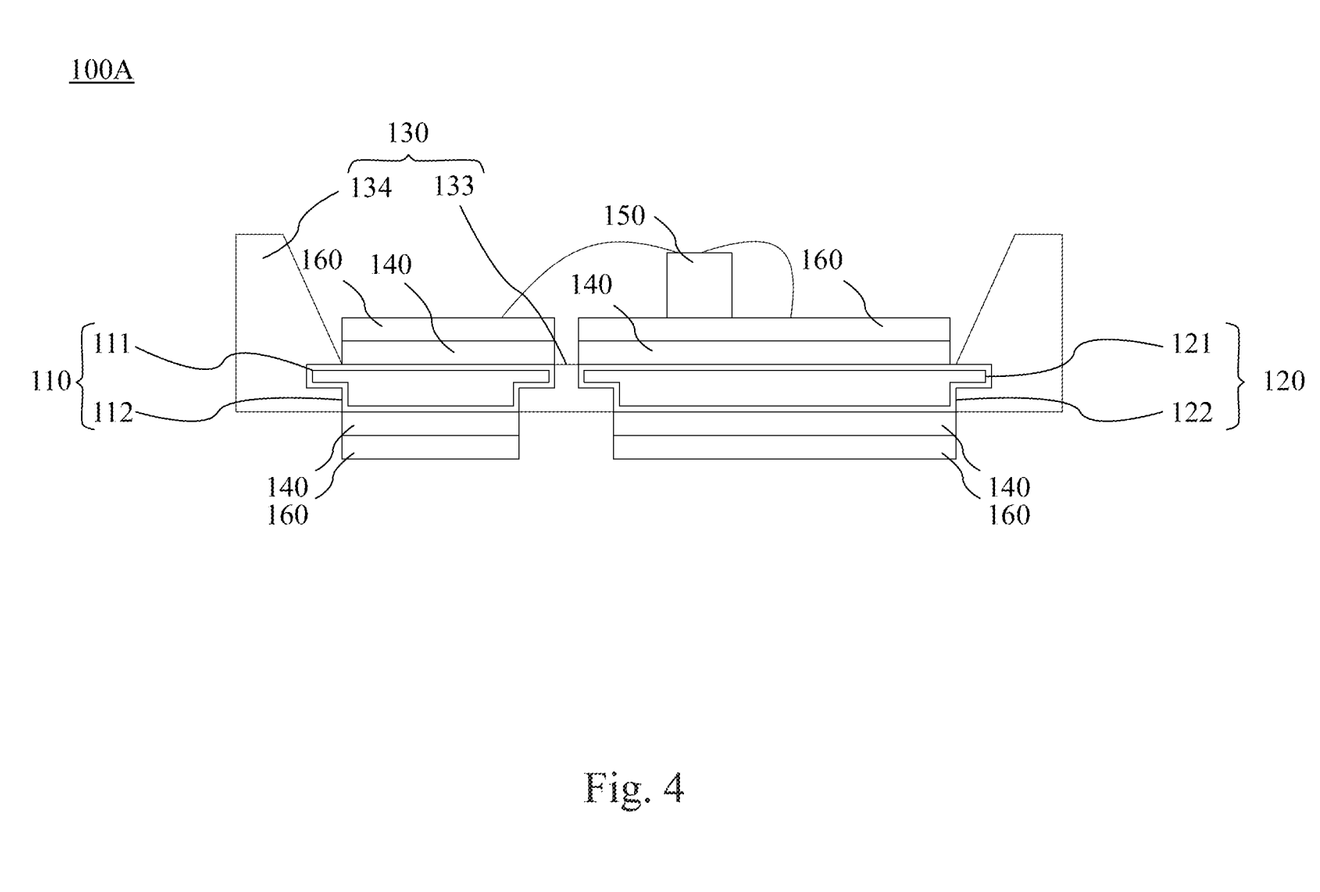
FIG. 4 is a schematic view of a light emitting diode module according to another embodiment of the present disclosure.

FIG. 4 is a schematic view of a light emitting diode module according to another embodiment of the present disclosure. Reference is made to FIG. 4. In another embodiment of the present disclosure, the light emitting diode module 100A is similar to the light emitting diode module 100 in the embodiment mentioned above. The light emitting diode module 100A includes a first conductive device 110, a second conductive device 120, an insulating structure 130 and a first plating layer 140.

In this embodiment, the light emitting diode module 100A includes a second plating layer 160. The second plating layer 160 is disposed on the first plating layer 140. To be specific, the second plating layer 160 in this embodiment is only disposed on the first plating layer 140.

For example, a material of the first plating layer 140 is palladium and a material of the second plating layer 160 is gold. Thus, the first plating layer 140 and the second plating layer 160 can form together a conductive structure suitable for electrically connecting with the light emitting diode chip 150. However, this does not intend to limit the present disclosure. In other embodiments of the present disclosure, the material of the first plating layer 140 and the material of the second plating layer 160 can be of other conductive materials.

Figure 5:
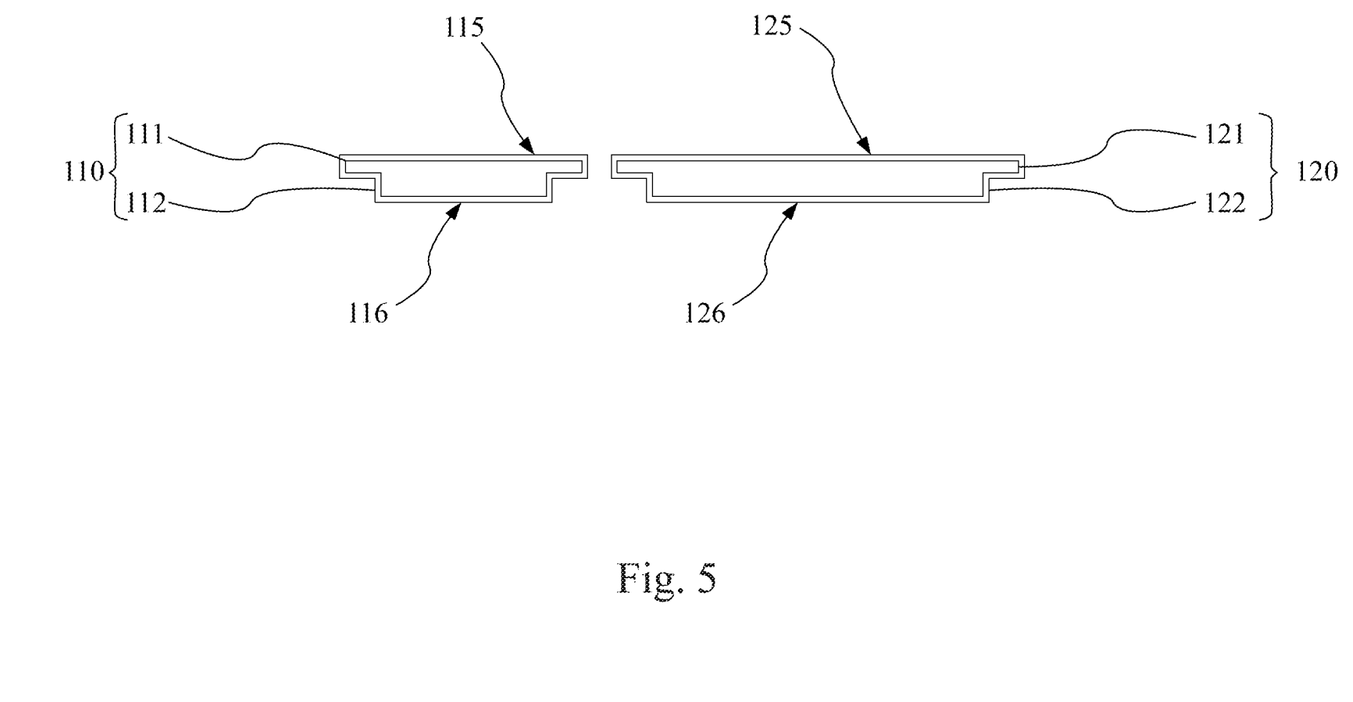
FIG. 5 to FIG. 7 are sectional views of a manufacturing process of a light emitting diode module according to an embodiment of the present disclosure.
Figure 6:
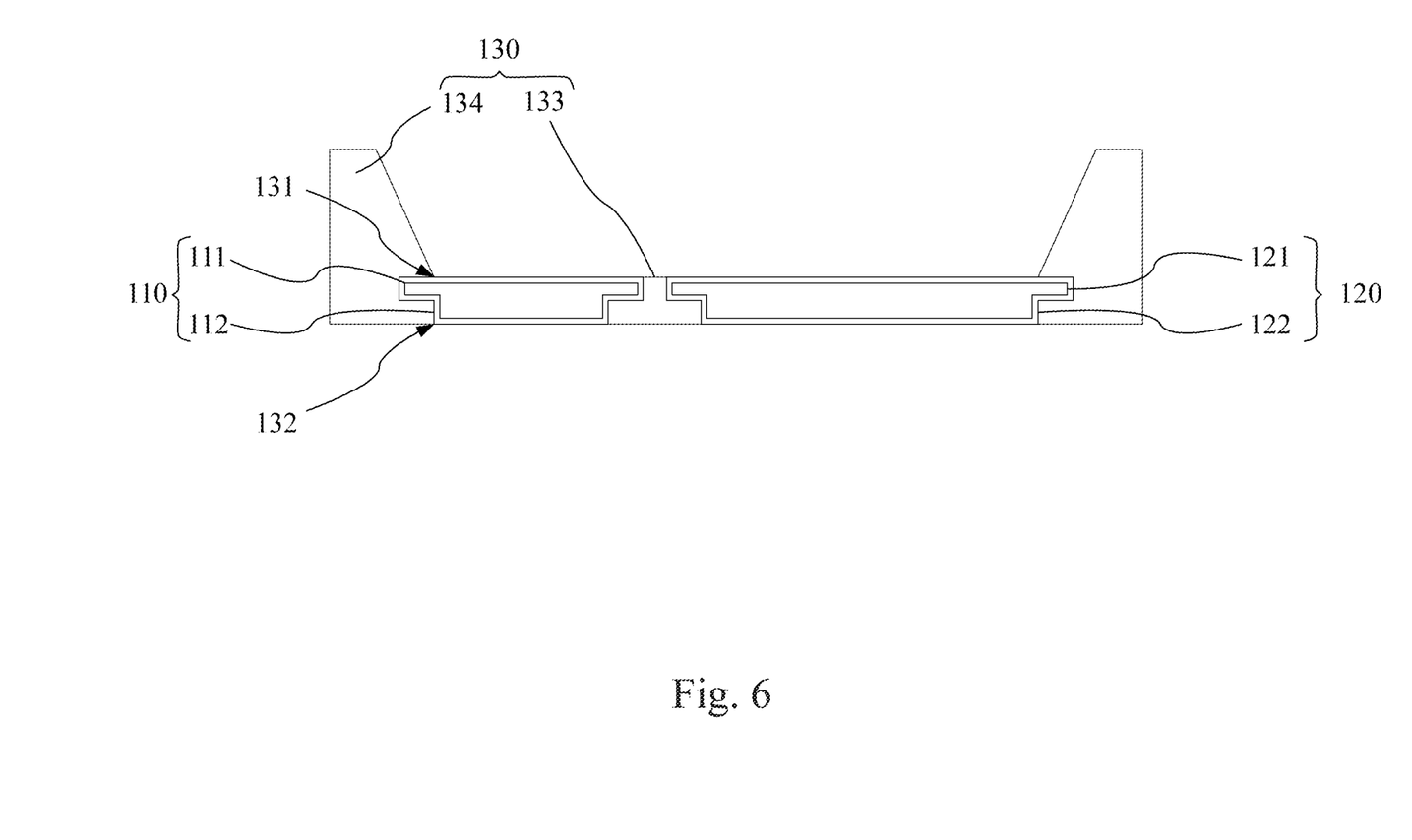
Figure 7:
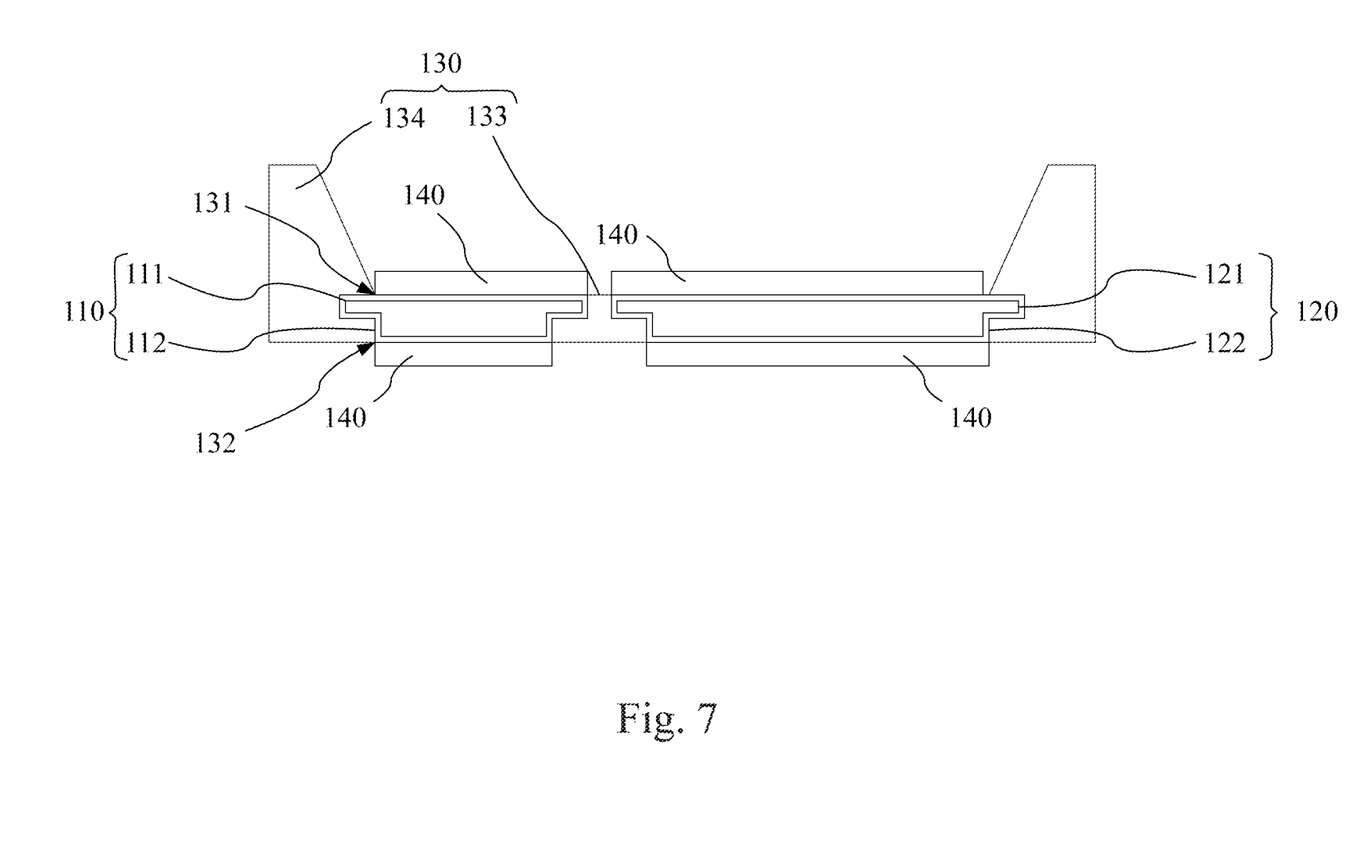

FIG. 5 to FIG. 7 are sectional views of a manufacturing process of a light emitting diode module according to an embodiment of the present disclosure. Reference is made to FIG. 5. According to a manufacturing method of the light emitting diode module in this embodiment, the first protecting layer 112 is covered on the first metal layer 111 to form the first conductive device 110, and the second protecting layer 122 is covered on the second metal layer 121 to form the second conductive device 120.

To be specific, the first upper surface 115 of the first conductive device 110 and the second upper surface 125 of the second conductive device 120 are coplanar. The first lower surface 116 of the first conductive device 110 and the second lower surface 126 of the second conductive device 120 are coplanar.

Reference is made to FIG. 6. According to the manufacturing method of this embodiment, the insulating structure 130 covers around the first conductive device 110 and around the second conductive device 120, and the insulating structure 130 includes the first opening 131 and the second opening 132.

Reference is made to FIG. 7. According to the manufacturing method of this embodiment, the first plating layer 140 is disposed on the first protecting layer 112 and the second protecting layer 122 in the first opening 131 and the second opening 132.

Therefore, the first plating layer 140 in this embodiment is only disposed on the first protecting layer 112 and the second protecting layer 122 exposed from the insulating structure 130. In other words, the insulating structure 130 and the first plating layer 140 cover around the first conductive device 110. The distribution regions of the insulating structure 130 and the first plating layer 140 on the first conductive device 110 do not overlap with each other. The insulating structure 130 and the first plating layer 140 cover around the second conductive device 120. The distribution regions of the insulating structure 130 and the first plating layer 140 on the second conductive device 120 do not overlap with each other. Through the steps as mentioned above, the manufacturing method in this embodiment can further dispose the light emitting diode chip 150 (please refer to FIG. 3) on the second conductive device 120 to form the light emitting diode module 100 (please refer to FIG. 3) as mentioned above.

On the other hand, the insulating structure 130 in this embodiment is formed from the way of stamping, such that a portion of the first protecting layer 112 and a portion of the second protecting layer 122 are exposed. In other embodiment, the manufacturing method further includes treating superficially (carrying out a surface treatment on) the insulating structure 130 and the first protecting layer 112 and the second protecting layer 122 exposed from the insulating structure 130 before disposing the first plating layer 140. In details, through the surface treatment to the insulating structure 130, and the surface treatment to the first protecting layer 112 and the second protecting layer 122 in the first opening 131 and the second opening 132 of the insulating structure 130, the burrs produced at the insulating structure 130 after the process of stamping and the metal oxide layer on the first protecting layer 112 and the second protecting layer 122 are removed.

Figure 8:
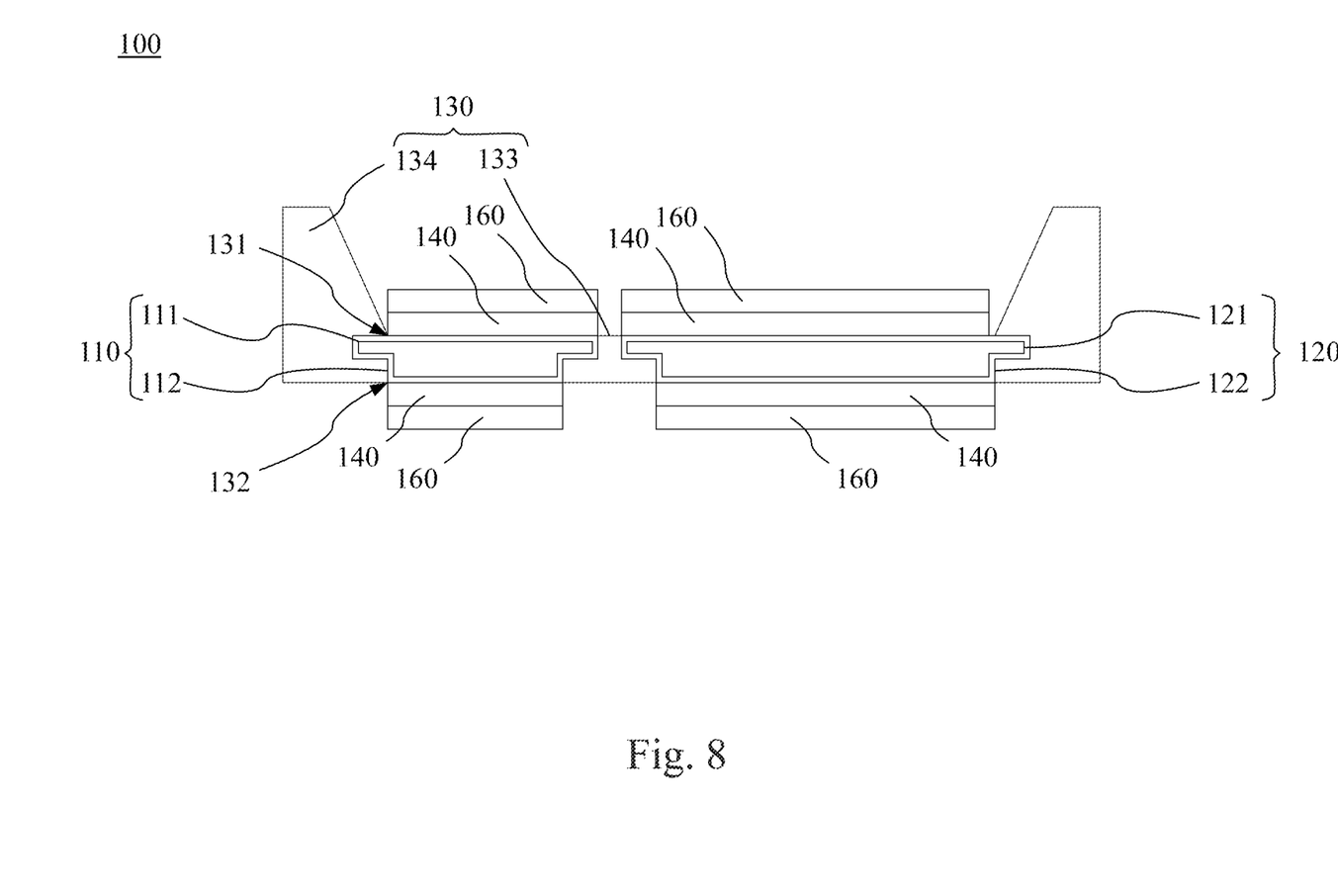
FIG. 8 is a sectional view of a manufacturing process of a light emitting diode module according to another embodiment of the present disclosure.

FIG. 8 is a sectional view of a manufacturing process of a light emitting diode module according to another embodiment of the present disclosure. Reference is made to FIG. 8. In another embodiment of the present disclosure, according to the manufacturing method of the light emitting diode module, the second plating layer 160 is further disposed on the first plating layer 140. Through the steps as mentioned above, the manufacturing method in this embodiment can further dispose a light emitting diode chip on the second conductive device 120 to form the light emitting diode module 100A (please refer to FIG. 4) as mentioned above.

In conclusion, when compared with the prior art, the aforementioned embodiments of the present disclosure have at least the following advantage: the light emitting diode module can provide a good interface of electrical connection though the protection of the first metal layer by the first protecting layer, the protection of the second metal layer by the second protecting layer, and the disposal of the first plating layer on the first conductive device and the second conductive device exposed from the insulating structure. The method of manufacturing the light emitting diode module in this embodiment can manufacture the light emitting diode module with a higher reliability through forming the first protecting layer and the second protecting layer before covering the insulating structure, and forming the first plating layer after covering the insulating structure.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A method of manufacturing a light emitting diode module, comprising:
   covering a first protecting layer on a first metal layer to form a first conductive device, and covering a second protecting layer on a second metal layer to form a second conductive device;
   covering around the first conductive device and around the second conductive device by an insulating structure, wherein the insulating structure comprises a first opening and a second opening;
   performing a superficial treatment to the insulating structure, the first protecting layer and the second protecting layer in the first opening and the second opening; and
   disposing a first plating layer on the first protecting layer and the second protecting layer in the first opening and the second opening after the superficial treatment.

2. The method of claim 1, further comprising:
   disposing a second plating layer on the first plating layer.

* * * * *